(12) United States Patent
Hong

(10) Patent No.: US 10,196,300 B2
(45) Date of Patent: Feb. 5, 2019

(54) FRIT MATERIAL, PHOTOELECTRIC PACKAGED DEVICE AND PACKAGING METHOD THEREOF, AND DISPLAY APPARATUS

(71) Applicant: BOE Technology Group Co., Ltd., Beijing (CN)

(72) Inventor: Rui Hong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/322,755

(22) PCT Filed: Jan. 29, 2016

(86) PCT No.: PCT/CN2016/072758
§ 371 (c)(1),
(2) Date: Dec. 29, 2016

(87) PCT Pub. No.: WO2017/031950
PCT Pub. Date: Mar. 2, 2017

(65) Prior Publication Data
US 2017/0197871 A1    Jul. 13, 2017

(30) Foreign Application Priority Data
Aug. 27, 2015   (CN) .......................... 2015 1 0536485

(51) Int. Cl.
*C03C 8/24*     (2006.01)
*C03C 27/06*    (2006.01)
(Continued)

(52) U.S. Cl.
CPC ............... *C03C 8/24* (2013.01); *C03C 3/122* (2013.01); *C03C 8/04* (2013.01); *C03C 8/14* (2013.01);
(Continued)

(58) Field of Classification Search
None
See application file for complete search history.

(56) References Cited

U.S. PATENT DOCUMENTS

| 6,534,427 B1 * | 3/2003 | Quemere | ................. C03C 8/14 |
|---|---|---|---|
| | | | 252/301.32 |
| 7,919,920 B2 * | 4/2011 | Kwak | ....................... C03C 8/24 |
| | | | 257/79 |

(Continued)

FOREIGN PATENT DOCUMENTS

| CN | 101186433 A | 5/2008 |
|---|---|---|
| CN | 102548925 A | 7/2012 |

(Continued)

OTHER PUBLICATIONS

International Search Report and Written Opinion of International Application No. PCT/CN2016/072758, dated May 25, 2016, 13 pages.

(Continued)

*Primary Examiner* — Michelle Mandala
(74) *Attorney, Agent, or Firm* — Westman, Champlin & Koehler, P.A.

(57) ABSTRACT

Examples of the present invention provide a frit material, a photoelectric packaged device and a packaging method thereof, and a display apparatus. They relates to the field of display technology, and may reduce the bubbles generated during the sintering of the frit material at high temperature, improve the flatness of the surface of the frit material, and increase the proportion of the packaged area after the frit material is adhered to the device substrate, to increase the mechanical strength of the packaged OLED panel, while the viscosity of the frit material is not affected. The frit material comprises frit-powders and an organic material comprising an organic thickener, wherein the frit material further comprises an inorganic thickener consisting of a clay mineral (Continued)

material. Examples of the present invention are used for production of the frit material, the photoelectric packaged device comprising the frit material, and the display apparatus.

13 Claims, 3 Drawing Sheets

(51) Int. Cl.
  *H01L 51/56* (2006.01)
  *C03C 3/12* (2006.01)
  *C03C 8/04* (2006.01)
  *H01L 51/00* (2006.01)
  *H01L 51/52* (2006.01)
  *C03C 8/14* (2006.01)
  *C03C 8/16* (2006.01)

(52) U.S. Cl.
  CPC ............... *C03C 8/16* (2013.01); *C03C 27/06* (2013.01); *H01L 51/0034* (2013.01); *H01L 51/5246* (2013.01); *H01L 51/56* (2013.01)

(56) References Cited

U.S. PATENT DOCUMENTS

| | | | |
|---|---|---|---|
| 8,505,337 B2 | 8/2013 | Burgess et al. | |
| 8,658,886 B2* | 2/2014 | Yang | H01G 9/2077 136/252 |
| 8,802,203 B2 | 8/2014 | Dennis | |
| 2005/0238803 A1* | 10/2005 | Tremel | B01J 20/183 427/180 |
| 2012/0213951 A1 | 8/2012 | Dennis | |
| 2012/0298187 A1* | 11/2012 | Kim | H01G 9/2081 136/251 |
| 2014/0326393 A1 | 11/2014 | Dennis | |

FOREIGN PATENT DOCUMENTS

| | | |
|---|---|---|
| CN | 103492334 A | 1/2014 |
| CN | 105047690 A | 11/2015 |

OTHER PUBLICATIONS

English translation of Box No. V of the Written Opinion for the International Searching Authority for International Application No. PCT/CN2016/072758, 2 pages.
First Office Action for Chinese Patent Application No. 201510536485.0, dated Jun. 19, 2017, 10 pages.

* cited by examiner

FRIT MATERIAL, PHOTOELECTRIC PACKAGED DEVICE AND PACKAGING METHOD THEREOF, AND DISPLAY APPARATUS

CROSS-REFERENCE TO RELATED APPLICATION

This application is a Section 371 National Stage Application of International Application No. PCT/CN2016/072758, filed on Jan. 29, 2016, entitled "FRIT MATERIAL, PHOTOELECTRIC PACKAGED DEVICE AND PACKAGING METHOD THEREOF, AND DISPLAY APPARATUS", which has not yet published, and which claims priority to Chinese Application No. 201510536485.0, filed on Aug. 27, 2015, incorporated herein by reference in their entirety.

TECHNICAL FIELD

The present invention relates to the field of display technology, in particular, to a frit material, a photoelectric packaged device and a packaging method thereof, and a display apparatus.

BACKGROUND ART

A frit material is a paste-like mixture composed of an inorganic material and an organic material and having a certain viscosity. It has advantages in low costs and simple process. Further, after being melted by laser, the frit material becomes an inorganic material, which has very good barrier performance against water and oxygen. Hence, currently, the packaging technology using the frit is the primary technology in packaging for mass-producing OLED (Organic Light-Emitting Display), and can impart the packaged OLED device long life-time.

Since the frit material is applied on the packaging region of the substrate to be packaged, it needs to undergo patterning processes, such as screening, dispensing, and the like, to form corresponding patterns. Therefore, main part of the organic material in the frit material is the organic thickener, which has the function of dispersing inorganic materials, such as frit-powders in the form of powder. If the amount of the organic thickener component is too small, it is difficult to enable the frit material to form a paste-like mixture having a certain viscosity, and thus difficult to be applied to form patterns.

Further, when the organic material is irradiated by laser, a flash explosion may occur, and harmful gas that affects the OLED device may be generated. Therefore, before the frit material is subjected to laser melting, it needs to undergo a pretreatment by sintering it at high temperature, so as to remove the organic materials by evaporation. Then, the frit material is adhered to the device substrate having OLED device formed thereon, to perform the laser packaging process.

However, the organic material will produce bubbles during the sintering at high temperature, while the thickness of the frit material applied on the substrate to be packaged is relatively small (generally, less than 10 μm). Therefore, the bubbles affect the morphology of the surface and interior of the frit material relatively greatly. The movement of the bubbles to the surface of the frit material under the influence of the high temperature will make the surface uneven. Hence, after the frit material is adhered to the device substrate, some regions of the device substrate actually are not in contact with the frit material. It results in poor package after the irradiation by laser, which reduces the mechanical strength of the packaged OLED panel. Additionally, inside the frit material, after the organic material is evaporated, it leaves bubbles, which can increase the inner stress of the frit material after being melted and cured, and further reduce the mechanical strength of the packaged OLED panel.

SUMMARY

An example of the present invention provides a frit material, a photoelectric packaged device and a packaging method thereof, and a display apparatus, which may reduce the bubbles generated during the sintering of the frit material at high temperature, improve the flatness of the surface of the frit material, and increase the proportion of the packaged area after the frit material is adhered to the device substrate, to increase the mechanical strength of the packaged OLED panel, while the viscosity of the frit material is not affected.

In order to achieve the above-mentioned objects, in examples of the present invention, the following technical solutions are used:

In one aspect, an example of the present invention provides a frit material, which comprises frit-powders and an organic material comprising an organic thickener, wherein the frit material further comprises an inorganic thickener consisting of a clay mineral material.

Preferably, the frit material has a viscosity ranging from $0.3 \times 10^5$ to $1.3 \times 10^5$ cps.

As an alternative option, the mass of the inorganic thickener accounts for 30 to 70% of the total mass of the inorganic thickener and the organic thickener.

As another alternative option, the mass of the inorganic thickener accounts for 3 to 15% of the total mass of the frit material.

Preferably, the clay mineral material comprises at least one of palygorskite, bentonite and kaolin.

Preferably, the inorganic thickener has a particle size ranging from 0.1 to 2.0 μm.

In another aspect, an example of the present invention further provides a photoelectric packaged device, comprising a first substrate and a second substrate disposed oppositely, a photoelectric element disposed between the first substrate and the second substrate, and a packaging material around the photoelectric element, wherein the packaging material, the first substrate and the second substrate forms a sealed space, wherein the packaging material is formed by curing the frit material of any one mentioned above.

In a further aspect, an example of the present invention further provides a display apparatus, wherein the display apparatus comprises the photoelectric packaged device mentioned above.

In yet an aspect, an example of the present invention further provides a packaging method of a photoelectric packaged device, comprising: providing a first substrate and a second substrate; wherein the second substrate has a photoelectric element to be packaged formed thereon, and the region on the first substrate corresponding to the region on the second substrate around the photoelectric element is a packaging region; forming the frit material of any one mentioned above in the packaging region on the first substrate; or, forming the frit material of any one mentioned above in the region on the second substrate around the photoelectric element; subjecting the frit material to a heat treatment; adhering one of the first substrate and the second substrate, which has the frit material formed thereon, to the other; subjecting the frit material to a laser irradiation.

Preferably, the temperature of the heat treatment ranges from 400 to 450° C., and the time of the heat treatment ranges from 10 to 60 min.

Preferably, a stage heating is used by the heat treatment.

On the basis of above, when the frit material provided in the example of the present invention, since the inorganic thickener is added in the frit material system, it is possible to reduce the proportion of the organic thickener in the frit material, while the effect of thickening does not change as compared with the frit material in the prior art. That is to say, a part of the organic thickener in the prior art is replaced by the inorganic thickener. The number of the bubbles generated during sintering the organic material at high temperature is reduced, the flatness of the surface of the frit material is improved and the bubbles remaining inside the frit material is reduced, and the proportion of the packaged area after the frit material is adhered to the device substrate is increased, so that the mechanical strength of the packaged OLED panel is increased, since the proportion of the organic thickener is reduced.

DESCRIPTION OF DRAWINGS

In order to explain examples of the present invention or technical solutions in the prior art more clearly, the drawings useful in the description of the examples or the prior art will be briefly introduced below. It is apparent that the drawings in the following description are only some examples of the present invention. According to these drawings, those skilled in the art can obtain other drawings without paying inventive labor.

REFERENCE SIGNS

Figure 1:
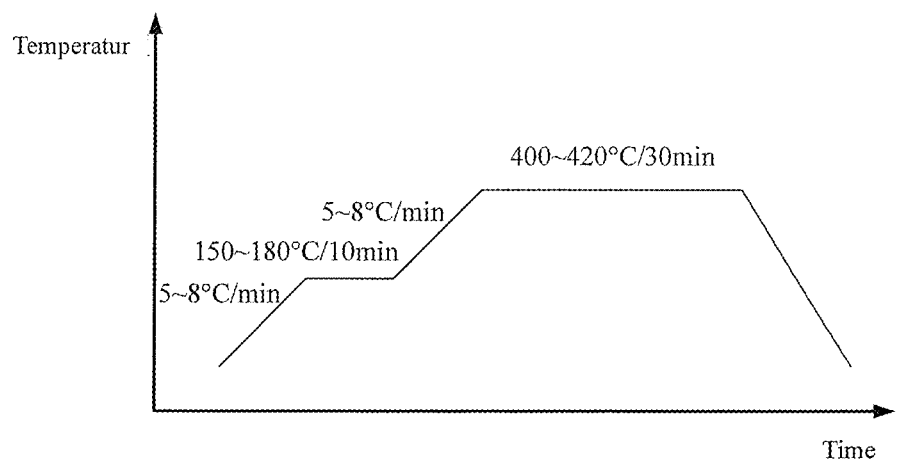
FIG. 1 is a temperature profile for high temperature sintering, for a frit material provided by the prior art and for a frit material provided by an example of the present invention.

01—photoelectric packaged device; 10—first substrate; 20—second substrate; 30—photoelectric element; 40—packaging material.

Specific Embodiments

The technical solutions in examples of the present invention will be clearly described below, referring to the drawings of the examples of the present invention. It is apparent that the examples described are only some of the examples of the present invention, but not all of the examples. All other examples obtained by those skilled in the art without inventive labor on the basis of the examples in the present invention pertain to the protection scope of the present invention.

It should be noticed that all terms (including technical and scientific terms) used in the examples of the present invention have the same meaning as understood by those skilled in the art, unless otherwise indicated. It should also be understood that the terms, such as those defined in ordinary dictionaries, should be interpreted as the meaning consistent with the context in related technology, but not be interpreted ideally or extremely formally, unless clearly indicated.

An example of the present invention provides a frit material. The frit material comprises frit-powders and an organic material. The organic material comprises an organic thickener. The frit material further comprises an inorganic thickener consisting of a clay mineral material.

It should be explained that firstly, the above-mentioned frit-powders can also be referred to as ceramic powders. For example, they may consist of at least one oxide material powders, such as $SiO_2$ (silicon dioxide), $Bi_2O_3$ (dibismuth trioxide), CaO (calcium oxide), ZnO (zinc oxide), $V_2O_5$ (divanadium pentoxide), $B_2O_3$ (diboron trioxide), $Al_2O_3$ (dialuminum trioxide), $Na_2O$ (sodium oxide), $K_2O$ (potassium oxide), MgO (magnesium oxide), $Sb_2O_3$ (distibium trioxide), $Li_2O$ (lithium oxide), BaO (barium oxide), SnO (tin oxide), or the like, in the form of powders.

Here, specific types and components of the above-mentioned frit-powders in the frit material can follow the prior art, for example, U.S. Pat. No. 7,923,393 B2, CN 1616366A, and the like. Examples of the present invention do not limit them here.

Secondly, the organic thickener may be, for example, EC (Ethyl cellulose, or ethocel) and/or BCA (2-(2-Butoxyethoxy)ethyl acetate, or butyl carbitol acetate).

Here, since EC is in the form of powders at the room temperature (also referred to as normal temperature or general temperature, generally speaking, the range of the room temperature has 3 definition: (1), 23° C.±2° C.; (2), 25° C.±5° C.; (3), 20° C.±5° C.), the organic material mentioned above can further comprises an organic solvent for dissolving EC. For example, it may be a mixed solvent by mixing organic solvents, such as acetic acid, an alcohol, or the like, in a certain ratio. BCA is a liquid at the room temperature. No additional solvent is needed to dissolve BCA.

Here, specific types of the organic thickener can follow the prior art, for example, CN 102709050A, and the like. Examples of the present invention do not limit them here.

Thirdly, the organic thickener and the inorganic thickener together make the above-mentioned frit material have a viscosity in a predetermined range. Values in this predetermined range may be the requirement for viscosity of a frit material in the prior art. That is to say, in the above-mentioned frit material system, a part of the liquid organic thickener component is replaced by an inorganic thickener consisting of a clay mineral material, such that the frit material system achieve the viscosity meeting the design specification of the processes, such as coating, by the actions of the two kinds of thickeners mentioned above.

When the viscosity of the frit material is too small (e.g. less than $0.3 \times 10^5$ cps), the problems of uneven surface morphology of the frit material during the patterning and inhomogeneous printing of patterns may be raised. When the viscosity of the frit material is too large (e.g. more than $1.3\times10^5$ cps), it tends to result in block of the pores of the screen plate, which affects the fineness degree of the screen pattering. Therefore, the viscosity value range of the frit material provided by examples of the present invention specifically may be from $0.3\times10^5$ to $1.3\times10^5$ cps, in order that the viscosity of the frit material meets the requirement of the design specification of the patterning process better. Here, cps is the unit of Brookfield viscosity "centipoise", and is used to represent the flow resistance of the liquid itself.

Here, in order to obtain a frit material that meets the requirement of the above-mentioned predetermined range of the viscosity, the proportions of the inorganic thickener can be refer to the following design for components.

As an alternative manner, it is possible to make the mass of the inorganic thickener accounting for 30 to 70% of the total thickener mass (i.e. the sum of the mass of the inorganic thickener and the mass of the organic thickener).

When the viscosity range of the frit material is further preferably from $0.5\times10^5$ to $1.0\times10^5$ cps, the mass of the inorganic thickener accounts for 40 to 60% of the total mass of the thickeners.

As another alternative manner, it is possible to make the mass of the inorganic thickener accounting for 3 to 15% of the total mass of the frit material.

When the viscosity range of the frit material is further preferably from $0.5\times10^5$ to $1.0\times10^5$ cps, the mass of the inorganic thickener accounts for 5 to 10% of the total mass of the frit material.

Fourthly, the inorganic thickener consisting of a clay mineral material comprises at least one of palygorskite, bentonite and kaolin. These clay mineral materials have a characteristic of not being not reactive with frit-powders and organics. In addition, they have relatively high stability, and can be dispersed in the frit material system stably.

Here, these clay mineral materials generally have morphology of powder form, and a preferred particle size range between 0.1 to 2.0 µm, so that the inorganic thickener may be dispersed in the frit material system more homogeneously.

Here, the specific species of the inorganic thickener is preferably palygorskite. Palygorskite has the chemical formula of $Mg_5Si_8O_{20}(OH)_2(OH_2)_4 \cdot 4H_2O$. It is a hydrated magnesium-rich silicate viscous mineral having chain structure. As compared with the other clay mineral materials, when palygorskite is dispersed in a liquid, the viscosity is higher. Small amount of palygorskite can achieve very good thickening effect, and thereby the amount of the organic thickener can be further decreased.

The particle size range of the inorganic thickener is further preferably 0.5 µm. This particle size can allow the powders of the inorganic thickener to be dispersed sufficiently, without causing the phenomenon of powders agglomeration due to too small particle size.

On the basis of above, when the frit material provided in the example of the present invention, since an inorganic thickener is added in the frit material system, it is possible to reduce the proportion of the organic thickener in the frit material, while the effect of thickening does not change as compared with the frit material in the prior art. That is to say, a part of the organic thickener in the prior art is replaced by inorganic thickener. The number of the bubbles generated during sintering the organic material at high temperature is reduced, the flatness of the surface of the frit material is improved and the bubbles remaining inside the frit material is reduced, and the proportion of the packaged area after the frit material is adhered to the device substrate is increased, so that the mechanical strength of the packaged OLED panel is increased, since the proportion of the organic thickener is reduced.

A group of tests for control is shown below, to illustrate the morphology difference between the frit material provided by the present invention and the frit material of the prior art in details.

Sample 1:

A frit material provided by the prior art was used. The frit-powders therein was Corning HCP-20 product available in market. The main component of the product was mixed powders of $V_2O_5$, BaO and ZnO (frit-powders). The product also comprised an organic material. The organic material comprised an organic thickener and an organic solvent. Among them, the organic thickener was EC, and the solvent was a mixture of diethylene glycol butyl ether acetate and α-terpineol. The resultant frit material had an overall viscosity of $0.5\times10^5$ cps, a density of 4.1 to 4.3 g/cc (gram/milliliter), and dark brown color.

Sample 2:

The same frit-powder components and organic solvent as those in Sample 1 were used, except that palygorskite as the inorganic thickener was used to replace 40% by mass of the EC in Sample 1, and the inorganic thickener accounted for 8% of the total mass of the frit material. Here, the average particle size of the palygorskite was 0.2 µm. A frit material provided by an example of the present invention, i.e. Sample 2, was obtained by mixing sufficiently. The parameters thereof were as follows. The viscosity was $0.55\times10^5$ cp. The density was 4.1 to 4.3 g/cc. The color was dark brown.

Patterned Sample 1 and Sample 2 were obtained by screen printing process. For Sample 1 and for Sample 2, the printing was the same. The process parameters were as follows. The printing speed was 80 mm/s (millimeter/second). The pressing amount in dispensing was 400 µm. The blade angle in printing was 75°. The printing width of the pattern could be 0.6 mm, 0.7 mm or 0.8 mm, for example.

The patterned Sample 1 and Sample 2 was subjected to high-temperature sintering treatment. The temperature profile was as shown in FIG. 1. Sample 1 and Sample 2 were heated at a speed of 5-8° C./min to a temperature of 150 to 180° C. and the temperature was kept for 10 minutes, and then they were heated at a speed of 5-8° C./min to a temperature of 400 to 420° C. and the temperature was kept for 30 minutes. Then they were left for cooling, and were cooled naturally to room temperature. The stage heating mode was used, in order that the organic material in Sample 1 and Sample 2 could be evaporated sufficiently, and the frit material was bonded to the substrate, so that the subsequent adhering and laser irradiation process could be carried out.

Figure 2A:
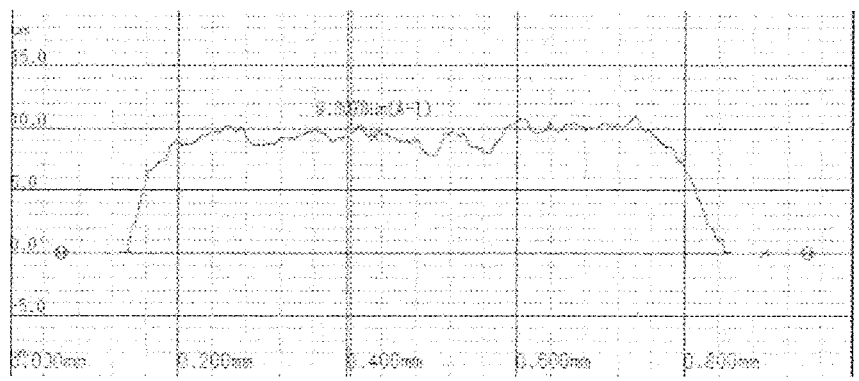
FIG. 2A is a morphology test result of a sintered frit material provided by the prior art, measured by a step profilometer.
Figure 2B:
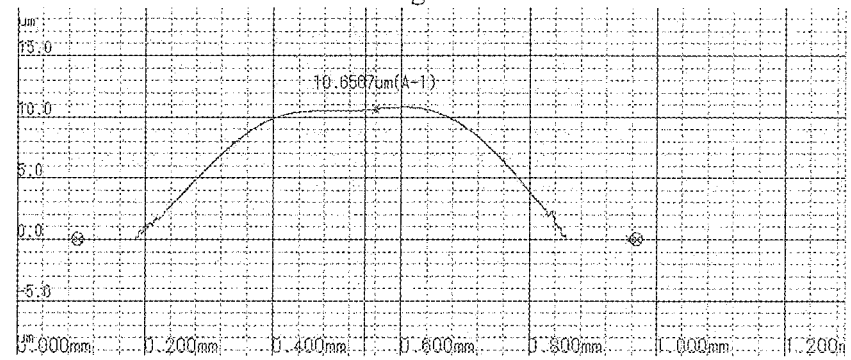
FIG. 2B is a morphology test result of a sintered frit material provided by an example of the present invention, measured by a step profilometer.

The surface morphologies of the sintered Sample 1 and Sample 2 were quantificationally tested by a step profilometer. The test results were shown in FIG. 2A and FIG. 2B. As can be seen, the thickness of Sample 1 was 9.3078 µm, wherein there are a lot of uneven parts on the surface, and the regularity of the surface was relatively poor. The thickness of Sample 2 was 10.6507 µm, wherein the surface morphology was obviously improved as compared with Sample 1, the surface was more flat, and there are few uneven parts. Additionally, the thickness of Sample 2 was not obviously different from Sample 1. This indicated, in the case that the overall viscosity of the frit material system falls within the predetermined range, the replacement of a part of the organic thickener by the inorganic thickener of powder form will not apparently increase the overall thickness of the frit material, will not affect the subsequent adhering and laser irradiation process, and can achieve the normal packaging.

Figure 3A:
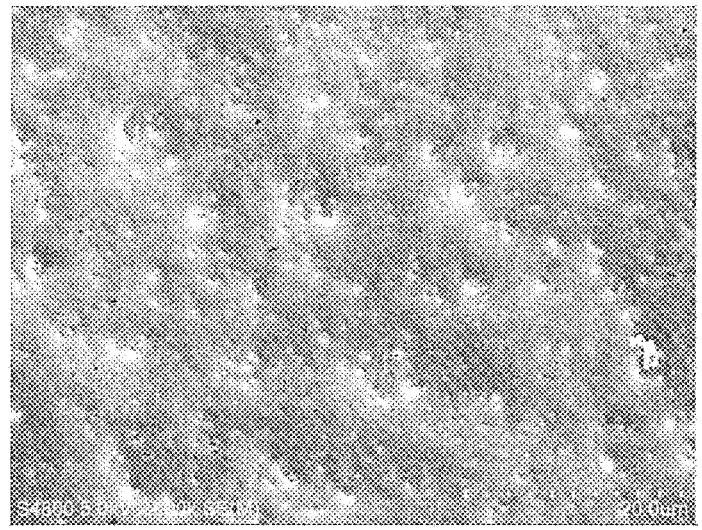
FIG. 3A is a surface morphology diagram (magnification: 2000) of a sintered frit material provided by the prior art, measured by SEM scanning
Figure 3B:
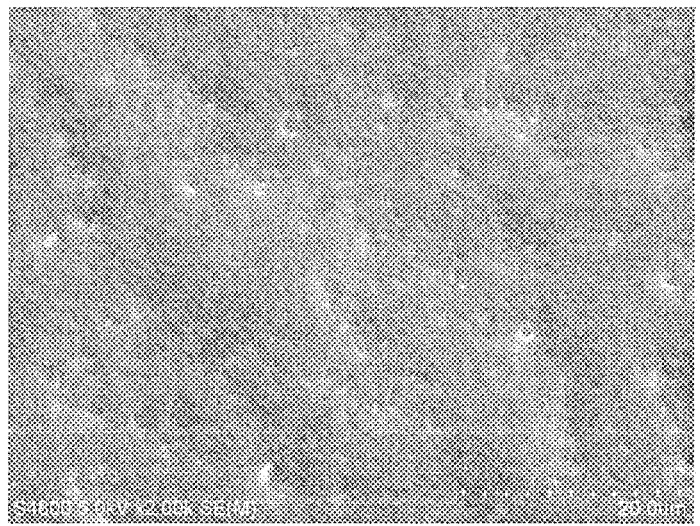
FIG. 3B is a surface morphology diagram (magnification: 2000) of a sintered frit material provided by an example of the present invention, measured by SEM scanning.

The surface and section morphologies of the sintered Sample 1 and Sample 2 were subjected to scanning tests by Scanning Electron Microscope (abbr. SEM), as shown in FIG. 3A and FIG. 3B. As can be seen, there were a lot of uneven parts on the surface of Sample 1, while the surface of Sample 2 was relatively flat and had less uneven regions. The results of the scanning tests were consistent with the results of the step profilometer testing. This further confirmed that when the frit material provided by the example of the present invention is used, in the case that the overall viscosity of the frit material system falls within the predetermined range, the replacement of a part of the organic thickener by the inorganic thickener of powder form will apparently improve the surface morphology of the frit material that has undergone the high-temperature sintering treatment, and increase the proportion of the packaged area.

Figure 4A:
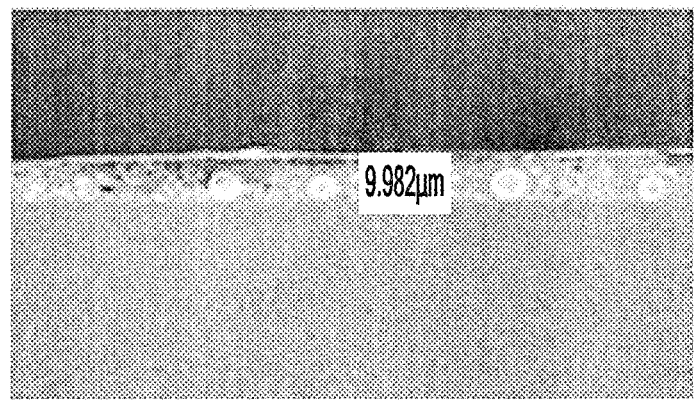
FIG. 4A is a section morphology diagram (magnification: 1500) of a sintered frit material provided by the prior art, measured by SEM scanning.
Figure 4B:
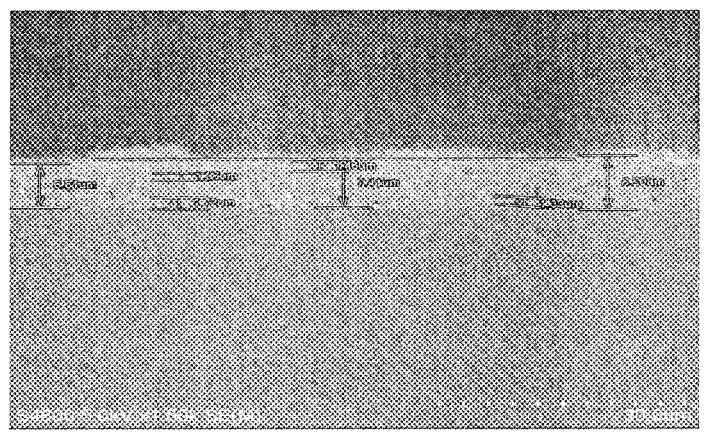
FIG. 4B is a section morphology diagram (magnification: 1500) of a sintered frit material provided by an example of the present invention, measured by SEM scanning.

Further results were shown in FIG. 4A and FIG. 4B. As can be seen, there were a lot of bubbles in the section of Sample 1. Additionally, the diameters of the bubbles were not quite different from the thickness of the frit material that has undergone the high-temperature sintering in order of magnitude. A lot of concentrated stress will be present in these bubbles, which would affect the mechanical strength of the frit material. However, no apparent bubble was present in the section of Sample 2. This indicated that the frit material has not bubbles or only has very few amount of bubbles inside after being sintered. No concentrated stress will occur, which further increase the mechanical strength of the frit material.

Here, the parameter 9.982 μm in FIG. 4A indicates the sectional thickness of the tested part of Sample 1. The parameters marked by the arrows in FIG. 4B indicate the sectional thicknesses of various regions in the tested part of Sample 2 and the diameters of the frit-powders after Sample 2 has undergone the high-temperature sintering treatment.

Figure 5:
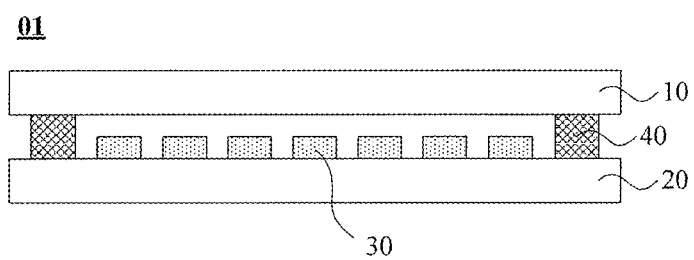
FIG. 5 is structural sectional schematic diagram of a photoelectric packaged device provided by an example of the present invention.

On the basis of above, as shown in FIG. 5, an example of the present invention also provides a photoelectric packaged device 01. The photoelectric packaged device 01 comprises: a first substrate 10 and a second substrate 20 disposed oppositely, a photoelectric element 30 disposed between the first substrate 10 and the second substrate 20, and a packaging material 40 around the photoelectric element. The packaging material 40 the first substrate 10 and the second substrate 20 forms a sealed space. Here, the packaging material 40 is formed by curing the frit material mentioned above.

Here, the photoelectric element 30 may be, for example, an OLED device, a membrane solar cell, or other elements. It is not limited herein.

Further, an example of the present invention also provides a packaging method of the above-mentioned photoelectric packaged device. The packaging method comprises:

S01. providing a first substrate and a second substrate; wherein the second substrate has a photoelectric element to be packaged formed thereon, and the region on the first substrate corresponding to the region on the second substrate around the photoelectric element is a packaging region;

S02. forming the above-mentioned frit material in the packaging region on the first substrate; or, forming the above-mentioned frit material in the region on the second substrate around the photoelectric element;

S03. subjecting the frit material to a heat treatment, to remove the organic material in the frit material, and allow the frit material to bond with the first substrate;

S04. adhering one of the first substrate and the second substrate, which has the frit material formed thereon, to the other;

S05. subjecting the frit material to a laser irradiation, to allow the frit material to bond with the second substrate.

It should be noticed that firstly, in the above step S02, the frit material may be formed in the packaging region on the first substrate by processes, such as screening, dispensing, and the like, or, the above-mentioned frit material may be formed in the region on the second substrate around the photoelectric element.

The frit material needs to be pretreated by high-temperature sintering in the following step S03, and the photoelectric elements to be packaged, such as the OLED device, the membrane solar cell, or other elements, are very sensitive to high temperature. Thus, a too high temperature will result in that the functional layers, such as the electron transfer layer, the hole transfer layer, or the like in the OLED, do not work. Therefore, in the above step S01, it is preferred to use the first substrate as a packaging substrate, and to use the second substrate having the photoelectric element to be packaged formed thereon as a device substrate. Further, in the following step S02, the patterned frit material is formed on the packaging substrate.

Secondly, in the above step S04, one of the first substrate and the second substrate, which has the above-mentioned frit material formed thereon, is adhered to the other. When the frit material is formed on the first substrate, the side of the first substrate on which the frit material is formed is adhered to the side of the second substrate on which the photoelectric element is formed.

Thirdly, the specific technical processes and parameters in the above steps S02 to S05 can follow the prior art, and are not described in details here. Some examples of the specific technical processes and parameters are the process for forming the pattern of the frit material, the temperature and time in the heat treatment, the adhering process of the first substrate and the second substrate, and the intensity of light and time in the laser irradiation.

Here, exemplarily, the temperature range in the heat treatment in the above step S03 is 400 to 450° C., and the time range of the heat treatment is 10 to 60 min, so that the organic material in the frit material can be evaporated sufficiently, and the frit material may be bonded to the substrate sufficiently, so that the subsequent adhering and laser irradiation process can be carried out.

Further, an example of the present invention also provides a display apparatus. The display apparatus comprises the above-mentioned photoelectric packaged device.

Here, the above-mentioned display apparatus may be a product or a part that has any display function, for example, an OLED panel, an OLED display, an OLED TV, a tablet PC, a mobile phone, an electric paper or a digital picture frame.

It should be notice that all drawings of the present invention are simple schematics of the frit material, the photoelectric packaged device and the packaging method thereof mentioned above. They are used only to show the structures relating to the inventive points in the technical solutions. Other structures irrelative to the inventive points are known structure, and thus they are not shown or only shown partially in the drawings.

The embodiments described above only some specific embodiments of the present invention. The protection scope of the present invention is not limited thereto. Any modifications or alternatives that can be envisaged by those skilled in the art, within the technical scope disclosed in the present invention, should be included in the protection scope of the present invention. Therefore, the protection scope of the present invention is determined by the protection scope defined by the claims.

The invention claimed is:

1. A frit material, which comprises fit-powders and an organic material comprising an organic thickener, wherein the frit material further comprises an inorganic thickener consisting of a clay mineral material,
wherein the mass of the inorganic thickener accounts for 5 to 15% of the total mass of the frit material.

2. The frit material according to claim 1, wherein the frit material has a viscosity ranging from $0.3 \times 10^5$ to $1.3 \times 10^5$ cps.

3. The frit material according to claim 2, wherein the mass of the inorganic thickener accounts for 30 to 70% of the total mass of the inorganic thickener and the organic thickener.

4. The frit material according to claim 1, wherein the clay mineral material comprises at least one of palygorskite, bentonite and kaolin.

5. The frit material according to claim 1, wherein the inorganic thickener has a particle size ranging from 0.1 to 2.0 μm.

6. A photoelectric packaged device, comprising a first substrate and a second substrate disposed oppositely, a photoelectric element disposed between the first substrate and the second substrate, and a packaging material around the photoelectric element, wherein the packaging material, the first substrate and the second substrate forms a sealed space, wherein the packaging material is formed by curing a frit material, which comprises frit-powders and an organic material comprising an organic thickener, wherein the frit material further comprises an inorganic thickener consisting of a clay mineral material.

7. A display apparatus, wherein the display apparatus comprises the photoelectric packaged device according to claim 6.

8. A packaging method of a photoelectric packaged device, comprising:
providing a first substrate and a second substrate; wherein the second substrate has a photoelectric element to be packaged formed thereon, and the region on the first substrate corresponding to the region on the second substrate around the photoelectric element is a packaging region;
forming a frit material, which comprises frit-powders and an organic material comprising an organic thickener, in the packaging region on the first substrate or in the region on the second substrate around the photoelectric element, wherein the frit material further comprises an inorganic thickener consisting of a clay mineral material;
subjecting the frit material to a heat treatment;
adhering one of the first substrate and the second substrate, which has the frit material formed thereon, to the other;
subjecting the frit material to a laser irradiation.

9. The packaging method according to claim 8, wherein the temperature of the heat treatment ranges from 400 to 450° C., and the time of the heat treatment ranges from 10 to 60 min.

10. The packaging method according to claim 8, wherein a stage heating is used by the heat treatment.

11. The frit material according to claim 1, wherein the organic thickener is ethyl cellulose.

12. The packaging method according to claim 9, wherein a stage heating is used by the heat treatment.

13. The frit material according to claim 4, wherein the clay mineral material comprises palygorskite.

* * * * *